United States Patent
Mo (10) Patent No.: US 11,916,050 B2
(45) Date of Patent: Feb. 27, 2024

(54) DISPLAY DEVICE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Chaode Mo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 583 days.

(21) Appl. No.: 17/057,101

(22) PCT Filed: Oct. 30, 2020

(86) PCT No.: PCT/CN2020/125468
§ 371 (c)(1),
(2) Date: Nov. 19, 2020

(87) PCT Pub. No.: WO2022/057030
PCT Pub. Date: Mar. 24, 2022

(65) Prior Publication Data
US 2022/0310572 A1    Sep. 29, 2022

(30) Foreign Application Priority Data
Sep. 15, 2020 (CN) .......................... 202010965508.0

(51) Int. Cl.
*H01L 25/16* (2023.01)
*H01L 27/12* (2006.01)
*H01L 23/00* (2006.01)

(52) U.S. Cl.
CPC ........ *H01L 25/167* (2013.01); *H01L 27/1259* (2013.01); *H01L 24/05* (2013.01);
(Continued)

(58) Field of Classification Search
None
See application file for complete search history.

(56) References Cited

U.S. PATENT DOCUMENTS

| 2003/0042849 A1 | 3/2003 | Ogino |
| 2011/0062478 A1* | 3/2011 | Negley .................. H01L 33/58 |
| | | 257/E33.068 |

(Continued)

FOREIGN PATENT DOCUMENTS

| CN | 102945828 A | 2/2013 |
| CN | 103553362 A | 2/2014 |

(Continued)

OTHER PUBLICATIONS

Machine-generated English translation of CN111583795A, total p. 16 (Year: 2020).*

(Continued)

*Primary Examiner* — Bo B Jang
(74) *Attorney, Agent, or Firm* — PV IP PC; Wei Te Chung; Zhigang Ma (57) ABSTRACT

The present invention discloses a display device and a manufacturing method thereof, including the following steps: forming a thin-film transistor array substrate, the thin-film transistor array substrate including a first surface and a second surface that are disposed opposite to each other; forming a protective layer on the first surface; forming a metal layer on the second surface by a first patterning; forming a metal member by performing a second patterning on the metal layer; forming a patterned insulating layer on the second surface; forming an electrode layer on the metal (Continued)

member; forming a planarization layer on the electrode layer and the insulating layer; and removing the protective layer.

13 Claims, 9 Drawing Sheets

(52) U.S. Cl.
CPC .... *H01L 27/124* (2013.01); *H01L 2224/0568* (2013.01); *H01L 2224/05572* (2013.01); *H01L 2224/05573* (2013.01); *H01L 2224/05624* (2013.01); *H01L 2224/05647* (2013.01)

(56) References Cited

U.S. PATENT DOCUMENTS

| | | | |
|---|---|---|---|
| 2015/0060843 A1 | 3/2015 | Lee et al. | |
| 2015/0331321 A1* | 11/2015 | Mo | G03F 1/42 430/320 |
| 2020/0312886 A1* | 10/2020 | Yuan | H10K 71/00 |

FOREIGN PATENT DOCUMENTS

| | | |
|---|---|---|
| CN | 110034150 A | 7/2019 |
| CN | 110112171 A | 8/2019 |
| CN | 110400809 A | 11/2019 |
| CN | 110416225 A | 11/2019 |
| CN | 110854133 A | 2/2020 |
| CN | 111583795 A | 8/2020 |

OTHER PUBLICATIONS

International Search Report in International application No. PCT/CN2020/125468, dated Jun. 17, 2021.
Written Opinion of the International Search Authority in International application No. PCT/CN2020/125468, dated Jun. 17, 2021.
Chinese Office Action issued in corresponding Chinese Patent Application No. 202010965508.0 dated Mar. 3, 2022, pp. 1-8.

* cited by examiner

DISPLAY DEVICE AND MANUFACTURING METHOD THEREOF

RELATED APPLICATIONS

This application is a Notional Phase of PCT Patent Application No. PCT/CN2020/125468 having international filing date of Oct. 30, 2020, which claims the benefit of priority of Chinese Patent Application No. 202010965508.0 filed on Sep. 15, 2020. The contents of the above applications are all incorporated by reference as if fully set forth herein in their entirety.

BACKGROUND OF INVENTION

Field of Invention

The present invention relates to the field of display technology, in particular to a display device and a manufacturing method thereof.

Description of Prior Art

Although organic light emitting diode (OLED) display devices and micro light-emitting diode (micro-LED) display devices do not require a sealant for packaging, based on driving requirements, wiring and binding positions must be arranged in the display area, resulting in an area outside the display area appearing on the display device, so that borderless display and seamless splicing cannot be realized. A double-sided process of thin-film transistor (TFT) array substrate is to perform outer lead bonding (OLB) on a back of the TFT array substrate, and then peripheral traces are connected to traces boning to the pins by fabricating metal wires at a side of the TFT array substrate, so as to achieve an object of seamless splicing or borderless display.

Whether it's the TFT array substrate on the front formed or the outer lead bonding on the back performed first, the double-sided process of the TFT array substrate requires processes such as film formation, exposure, development, and etching performing on opposite sides of the TFT array substrate. At present, a commonly used method for the back side process is to first make a layer of transparent non-metallic film on the back side, and then perform the back side process by accurate alignment with a mark of the front side, including alignment and cutting, etc. However, production of the mark of the non-metallic film mark requires vacuum film formation, photomask patterning, etching, and the like. In addition, the reflectivity of the non-metallic film is extremely low, and since the subsequent alignment can only be identified by grayscale, in order to improve the mark recognition ability of the back side process, a layer of metal generally covers the mark of non-metal film. As such, the manufacturing steps of this method are relatively complicated.

Therefore, there is a need to propose a new technical solution to solve the above technical problems.

SUMMARY OF INVENTION

Embodiments of the present invention provide a display device and a manufacturing method thereof, which are used to improve the technical problem that the steps of the double-sided process of the display device are relatively complicated.

An embodiment of the present invention provides a method of manufacturing a display device, including the following steps:
step A: forming a thin-film transistor array substrate, the thin-film transistor array substrate including a first surface and a second surface that are disposed opposite to each other;
step B: forming a protective layer on the first surface of the thin-film transistor array substrate;
step C: forming a metal layer on the second surface of the thin-film transistor array substrate by a first patterning;
step D: forming a metal member by performing a second patterning on the metal layer;
step E: forming a patterned insulating layer on the second surface of the thin-film transistor array substrate, the insulating layer covering at least a part of the metal member;
step F: forming an electrode layer on the metal member;
step G: forming a planarization layer on the electrode layer and the insulating layer;
step H: removing the protective layer;
step I: disposing a light emitting diode (LED) chip on the first surface of the thin-film transistor array substrate; and
step J: disposing an optical film on the LED chip.

In the method of manufacturing the display device provided by an embodiment of the present invention, the step C includes:
step c11: forming a metal film on the second surface of the thin-film transistor array substrate;
step c12: forming a first photoresist layer on the metal film;
step c13: exposing the first photoresist layer at a first predetermined position;
step c14: developing the first photoresist layer at the first predetermined position;
step c15: etching the metal film at the first predetermined position; and
step c16: stripping the first photoresist layer to form the metal layer.

In the method of manufacturing the display device provided by an embodiment of the present invention, the step c13 includes: exposing the first photoresist layer at the first predetermined position by edge exposure, wherein patterns formed by the edge exposure include a square shape, a shape of two squares attached to each other, a square grid shape, or combinations thereof.

In the method of manufacturing the display device provided by an embodiment of the present invention, the step D includes:
step d11: forming a second photoresist layer on the metal layer;
step d12: exposing the second photoresist layer at a second predetermined position with a photomask;
step d13: developing the second photoresist layer to remove the second photoresist layer at the second predetermined position;
step d14: etching the metal layer at the second predetermined position to form the metal member; and
step d15: stripping the second photoresist layer.

In the method of manufacturing the display device provided by an embodiment of the present invention, the protective layer in the step B is made of a material including at least one of silicon nitride, silicon oxide, silicon oxynitride, and an organic material.

In the method of manufacturing the display device provided by an embodiment of the present invention, a thickness of the protective layer is greater than 100 nanometers.

In the method of manufacturing the display device provided by an embodiment of the present invention, the step H comprises:

removing the protective layer by dry etching or high temperature melting.

In the method of manufacturing the display device provided by an embodiment of the present invention, the step G includes:

coating a positive or negative organic photoresist material by slit-coating or inkjet printing to form the planarization layer.

In the method of manufacturing the display device provided by an embodiment of the present invention, a thickness of the planarization layer ranges between 1.5 micrometers and 5.0 micrometers.

In the method of manufacturing the display device provided by an embodiment of the present invention, the metal member is made of a material including copper, aluminum, molybdenum, or combinations thereof.

In the method of manufacturing the display device provided by an embodiment of the present invention, the thin-film transistor array substrate includes:

a substrate;
a light-shielding layer disposed on the substrate;
a buffer layer covering the substrate and the light-shielding layer;
an active layer disposed on the buffer layer;
a gate insulating layer disposed on the active layer;
a gate disposed on the gate insulating layer;
an interlayer dielectric layer covering the active layer, the gate, and the gate insulating layer;
a source and a drain disposed on the interlayer dielectric layer;
a passivation layer covering the source, the drain, and the interlayer dielectric layer; and
a pixel electrode layer disposed on the passivation layer.

In the method of manufacturing the display device provided by an embodiment of the present invention, a material of the light-shielding layer includes a black metal light-shielding material, an inorganic oxide light-shielding material, an organic light-shielding material, or combinations thereof.

In the method of manufacturing the display device provided by an embodiment of the present invention, the LED chip includes a mini-LED chip and/or a micro-LED chip.

Another embodiment of the present invention also provides a display device, which includes:

a thin-film transistor array substrate including a first surface and a second surface which are disposed opposite to each other;
an LED chip disposed on the first surface of the thin-film transistor array substrate;
an optical film disposed on the LED chip;
a metal member disposed on the second surface of the thin-film transistor array substrate;
an insulating layer covering the second surface of the thin-film transistor array substrate and at least a part of the metal member;
an electrode layer disposed on the metal member; and
a planarization layer covering the electrode layer and the insulating layer,
wherein the metal member is formed by two patterning processes.

In the display device provided by an embodiment of the present invention, the metal member is formed by etching a metal film to form a metal layer, followed by etching the metal layer.

In the display device provided by an embodiment of the present invention, a thickness of the planarization layer ranges between 1.5 micrometers and 5.0 micrometers.

In the display device provided by an embodiment of the present invention, the thin-film transistor array substrate includes:

a substrate;
a light-shielding layer disposed on the substrate;
a buffer layer covering the substrate and the light-shielding layer;
an active layer disposed on the buffer layer;
a gate insulating layer disposed on the active layer;
a gate disposed on the gate insulating layer;
an interlayer dielectric layer covering the active layer, the gate, and the gate insulating layer;
a source and a drain disposed on the interlayer dielectric layer;
a passivation layer covering the source, the drain, and the interlayer dielectric layer; and
a pixel electrode layer disposed on the passivation layer.

In the display device provided by an embodiment of the present invention, a material of the light-shielding layer includes a black metal light-shielding material, an inorganic oxide light-shielding material, an organic light-shielding material, or combinations thereof.

In the display device provided by an embodiment of the present invention, the LED chip includes a mini-LED chip and/or a micro-LED chip.

In the display device provided by an embodiment of the present invention, the metal member is made of a material including copper, aluminum, molybdenum, or combinations thereof.

Embodiments of the present invention provide a display device and a method of manufacturing the display device. In the method of manufacturing the display device, the metal member is formed on the second surface of the thin-film transistor array substrate through two patterning processes. Compared with the process of manufacturing the metal member in the prior art, the method of manufacturing the metal member in an embodiment of the present invention is not only to omit the steps of manufacturing the non-metal layer and the metal layer used for alignment on the non-metal layer, reducing a photomask, thereby improving the technical problem that the steps of the double-sided process of the display device are relatively complicated, but also to greatly reduce investment in time cost and production cost.

DETAILED DESCRIPTION OF PREFERRED EMBODIMENTS

In order to make the objectives, technical solutions, and advantages of the present invention clearer, the present invention will be described in further detail below with reference to the accompanying drawings. Referring to the drawings, wherein the same reference symbols represent the same elements. The following description is based on the specific embodiments of the present invention, which should not be construed as limiting other specific embodiments of the present invention that are not detailed herein. The term "embodiment" used in this specification means an example, instance, or illustration.

In the description of this application, it should be understood that the terms "center", "longitudinal", "transverse", "length", "width", "thickness", "upper", "lower", "front", "Rear", "left","right","vertical","horizontal","top","bottom","inside","outside","clockwise","counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

Figure 1:
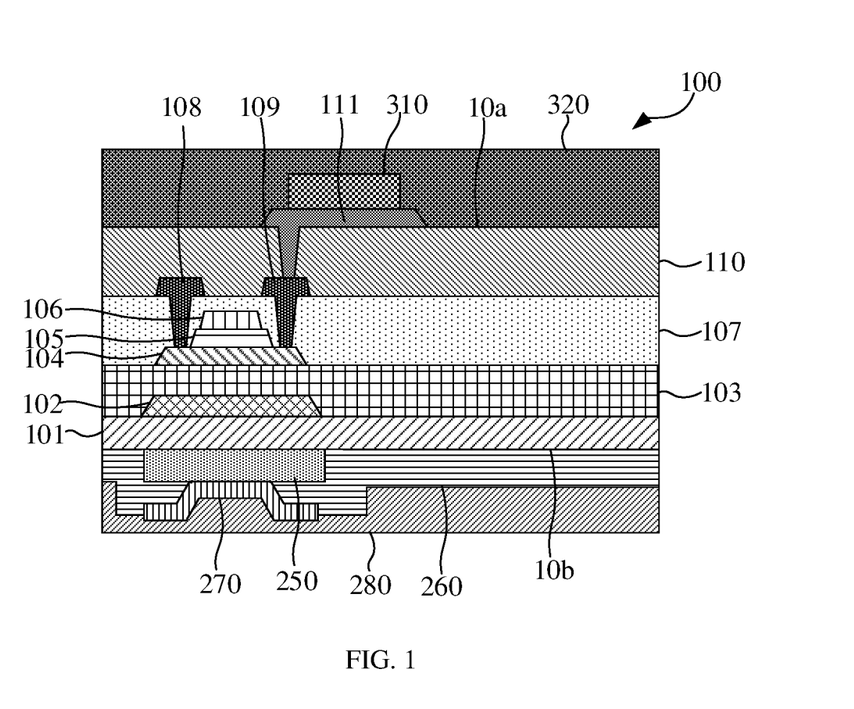
FIG. 1 is a schematic structural diagram of a display device provided by an embodiment of the present invention.

Referring to FIG. 1, an embodiment of the present invention provides a display device, and the display device 100 includes:

a thin-film transistor array substrate has a first surface 10a and a second surface 10b which are arranged oppositely. Specifically, the thin-film transistor array substrate further includes a substrate 101, a light-shielding layer 102, a buffer layer 103, an active layer 104, a gate insulating layer 105, a gate 106, an interlayer dielectric layer 107, a source 108, a drain 109, a passivation layer 110, and a pixel electrode layer 111. The light-shielding layer 102 is disposed on the substrate 101. The buffer layer 103 covers the substrate 101 and the light-shielding layer 102. A material of the buffer layer 103 includes at least one of silicon nitride ($SiN_x$), silicon oxide ($SiO_x$), and silicon oxynitride ($SiO_xN_y$). The active layer 104 is disposed on the buffer layer 103. The gate insulating layer 105 is disposed on the active layer 104. The gate 106 is disposed on the gate insulating layer 105. The interlayer dielectric layer 107 covers the active layer 104, the gate 106, and the gate insulating layer 105. The source 108 and the drain 109 are disposed on the interlayer dielectric layer 107 and are electrically connected to the active layer 104 through via holes. The passivation layer 110 covers the source 108, the drain 109, and the interlayer dielectric layer 107. The pixel electrode layer 111 is disposed on the passivation layer 110 and is electrically connected to the drain 109 through a via hole.

An LED chip 310 is arranged on the first surface 10a.

The LED chip includes a mini-LED chip and/or a micro-LED chip.

An optical film 320 is arranged on the LED chip 310.

The optical film 320 is configured to diffuse the light emitted by the LED chip.

A metal member 250 is disposed on the second surface 10b.

The metal member 250 is formed by two patterning processes. Specifically, the metal member 250 is formed by etching a metal film to form a metal layer, followed by etching the metal layer.

An insulating layer 260 covering the second surface 10b and at least a part of the metal member 250.

An electrode layer 270 is disposed on the metal member 250.

A planarization layer 280 covers the electrode layer 270 and the insulating layer 260.

It should be noted that the display device 100 provided in the embodiment of the present invention can be used for direct display, for example, as a micro-LED display device or a mini-ED display device, applied to the field of display technology.

Figure 2:
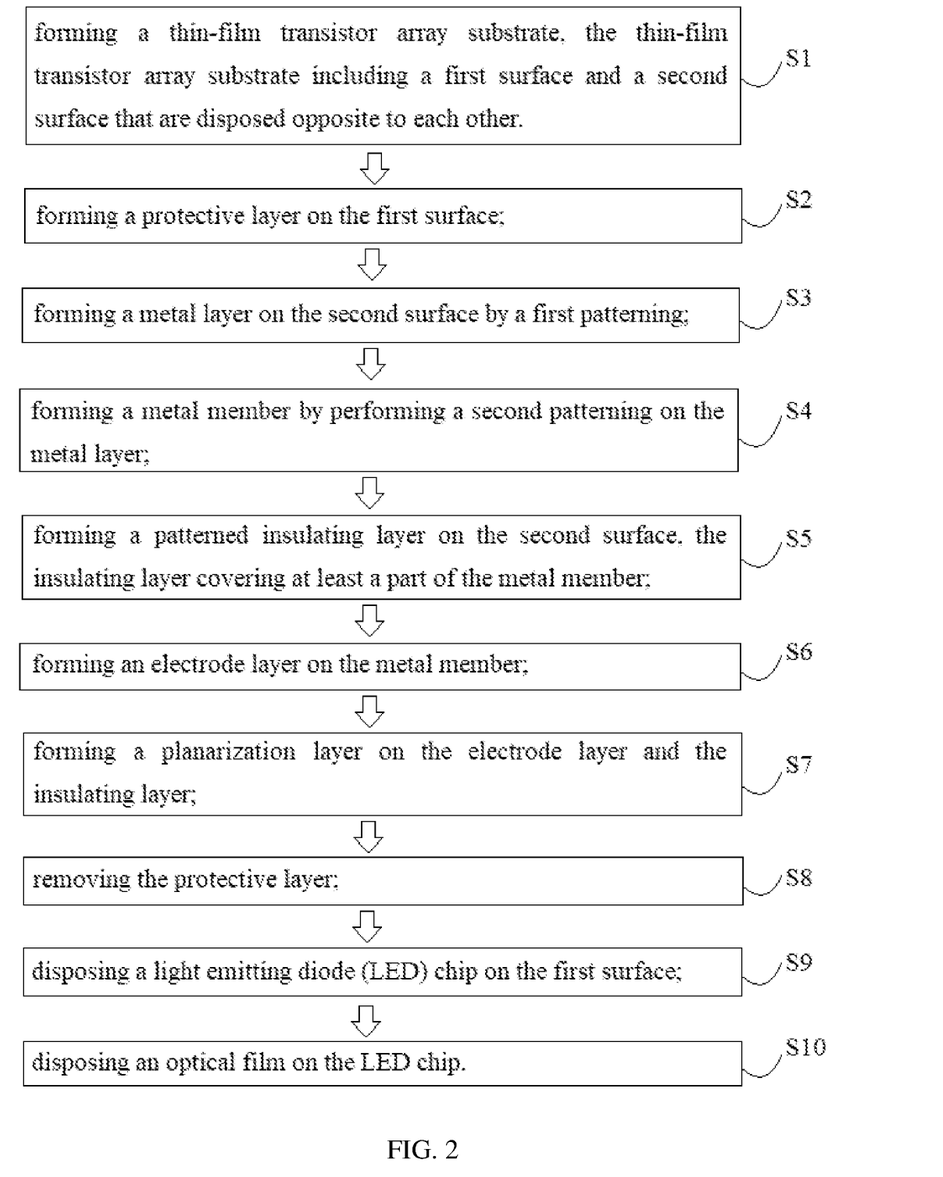
FIG. 2 to FIG. 4 are a flowchart showing steps of a method of manufacturing a display device provided by an embodiment of the present invention.

Referring to FIG. 2, the method of manufacturing the display device 100 provided by an embodiment of the present invention includes the following steps:

step S1: forming a thin-film transistor array substrate, the thin-film transistor array substrate including a first surface and a second surface that are disposed opposite to each other.

Figure 5:
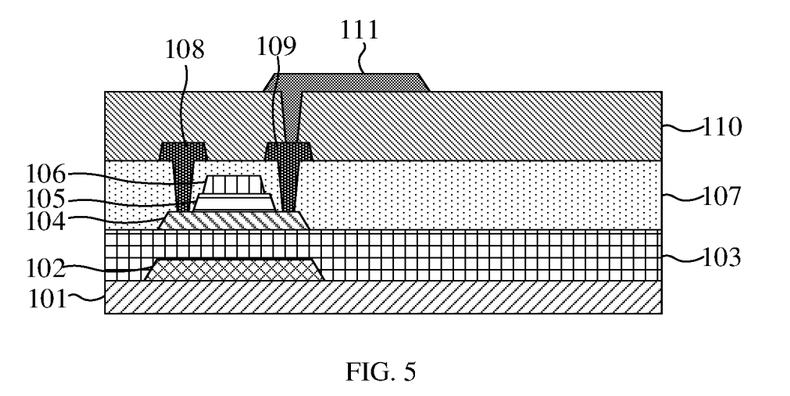
FIG. 5 to FIG. 15 are schematic diagrams of a method of manufacturing a display device provided by an embodiment of the present invention.

Referring to FIG. 5, the thin-film transistor array substrate includes a substrate 101, a light-shielding layer 102, a buffer layer 103, an active layer 104, a gate insulating layer 105, a gate 106, an interlayer dielectric layer 107, a source 108, a drain 109, a passivation layer 110, and a pixel electrode layer 111.

step S2: forming a protective layer on the first surface;
step S3: forming a metal layer on the second surface by a first patterning;
step S4: forming a metal member by performing a second patterning on the metal layer;
step S5: forming a patterned insulating layer on the second surface, the insulating layer covering at least a part of the metal member;
step S6: forming an electrode layer on the metal member;
step S7: forming a planarization layer on the electrode layer and the insulating layer;
step S8: removing the protective layer;
step S9: disposing a light emitting diode (LED) chip on the first surface; and
step S10: disposing an optical film on the LED chip.

Specifically, in the step S1, still referring to FIG. 5, a light-shielding layer 102 is deposited on the substrate 101, wherein the substrate 101 includes one of a glass substrate and a flexible substrate, and a material of the light-shielding layer 102 includes a black metal light-shielding material, an inorganic oxide light-shielding material, an organic light-shielding material, or combinations thereof.

Secondly, a buffer layer 103 is deposited on the substrate 101 and the light-shielding layer 102, and the buffer layer 103 covers the substrate 101 and the light-shielding layer 102. A material of the buffer layer 103 includes at least one of silicon nitride ($SiN_x$), silicon oxide ($SiO_x$), and silicon oxynitride ($SiO_xN_y$).

Next, an active layer 104 is deposited on the buffer layer 103. The active layer 104 is arranged corresponding to the light-shielding layer 102, and an orthographic projection of the active layer 104 on the substrate 101 is less than or equal to an orthographic projection of the light-shielding layer 102 on the substrate 101. The active layer 104 includes a low-temperature polysilicon active layer and an oxide active layer. In an optional embodiment, the active layer 104 in an embodiment of the present invention is an indium gallium zinc oxide (IGZO) active layer. Indium gallium zinc oxide has the advantages of large bandgap width (>3.0 eV), high electron mobility (>70 cm2/Vs), low off-state leakage current, low process temperature, and good stability. Meanwhile, electron mobility of amorphous α-IGZO is also relatively high (>10 cm2/Vs), which is about 10 times that of amorphous α-Si:H. The light-shielding layer 102 is configured to block the light source of the side of the substrate 101 from irradiating on the active layer 104.

Subsequently, the gate insulating layer 105, the gate 106, and the interlayer dielectric layer 107 are sequentially deposited on the active layer 104. The gate insulating layer 105 is disposed on the active layer 104, the gate 106 is disposed on the gate insulating layer 105, and the interlayer dielectric layer 107 covers the active layer 104, the gate insulating layer 105, and the gate 106. Then, the source 108 and the drain 109 are formed through a patterning process, and the source 108 and the drain 109 are electrically connected to the active layer 104 through the via holes.

Next, a passivation layer 110 is deposited on the interlayer dielectric layer 107, and the passivation layer 110 covers the source 108, the drain 109, and the interlayer dielectric layer 107.

Finally, a pixel electrode layer 111 is deposited on the passivation layer 110, and the pixel electrode layer 111 is electrically connected to the drain 109 through the via hole. A material of the pixel electrode layer 111 includes, but is not limited to a metal material. For example, the pixel electrode layer 111 is made of a material including copper, aluminum, molybdenum, or combinations thereof.

Figure 6:
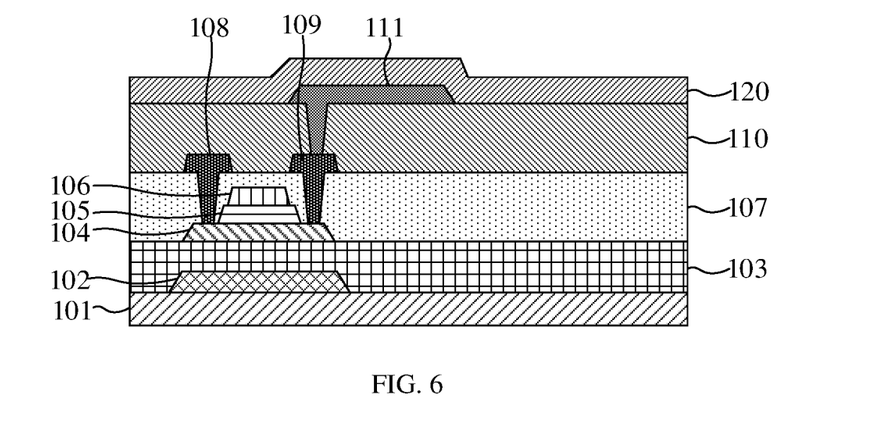

Referring to FIG. 6, in the step S2, a protective layer 120 is deposited on the first surface 10a of the thin-film transistor array substrate by chemical vapor deposition (CVD). A material of the protective layer 120 includes at least one of silicon nitride, silicon oxide, silicon oxynitride, and an organic material. For example, the protective layer 120 is an inorganic oxide film made of a material such as silicon nitride ($SiN_x$), silicon oxide ($SiO_x$), and silicon oxynitride ($SiO_xN_y$). Alternatively, the protective layer 120 is a polymer film, for example, the protective layer 120 is made of polytetrafluoroethylene. A thickness of the protective layer 120 is greater than 100 nanometers. The protective layer 120 is configured to protect the first surface 10a of the thin-film transistor array substrate to prevent the first surface 10a of the thin-film transistor array substrate from being scratched during the process of manufacturing the second surface 10b of the thin-film transistor array substrate, thereby impacting the product yield.

Figure 3:
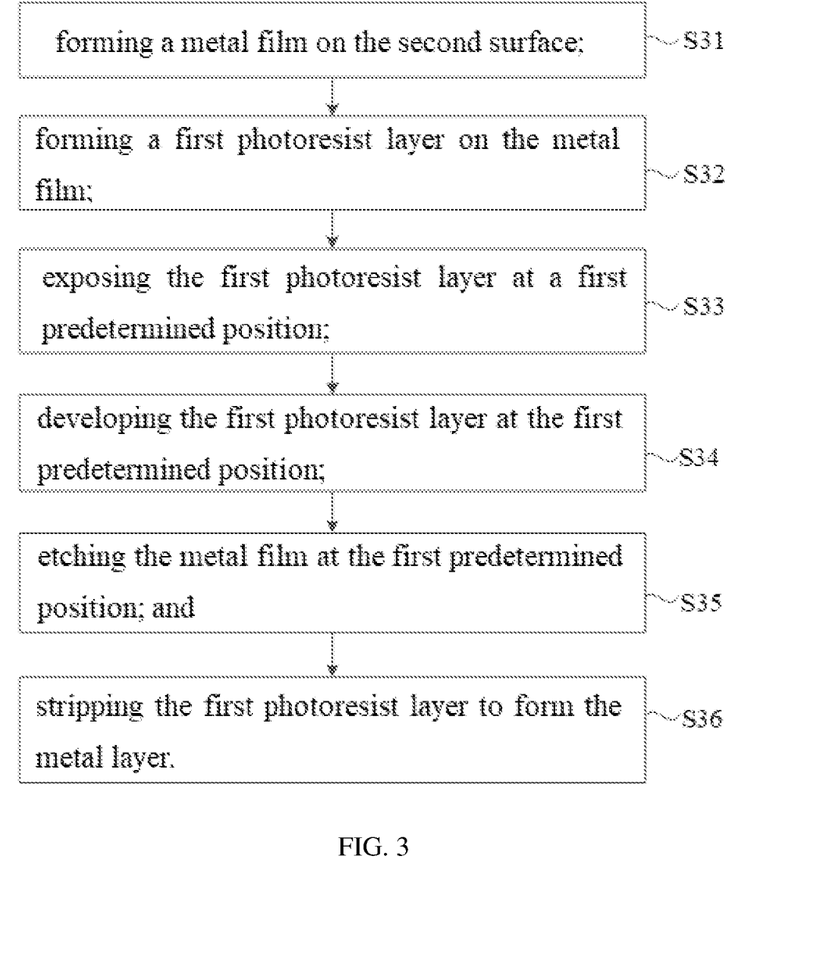

Referring to FIG. 3, FIG. 3 is a flowchart showing the step S3 in the method of manufacturing the display device in an embodiment of the present invention. The step S3 includes:
step S31: forming a metal film on the second surface;
step S32: forming a first photoresist layer on the metal film;
step S33: exposing the first photoresist layer at a first predetermined position;
step S34: developing the first photoresist layer at the first predetermined position;
step S35: etching the metal film at the first predetermined position; and
step S36: stripping the first photoresist layer to form the metal layer.

Figure 7:
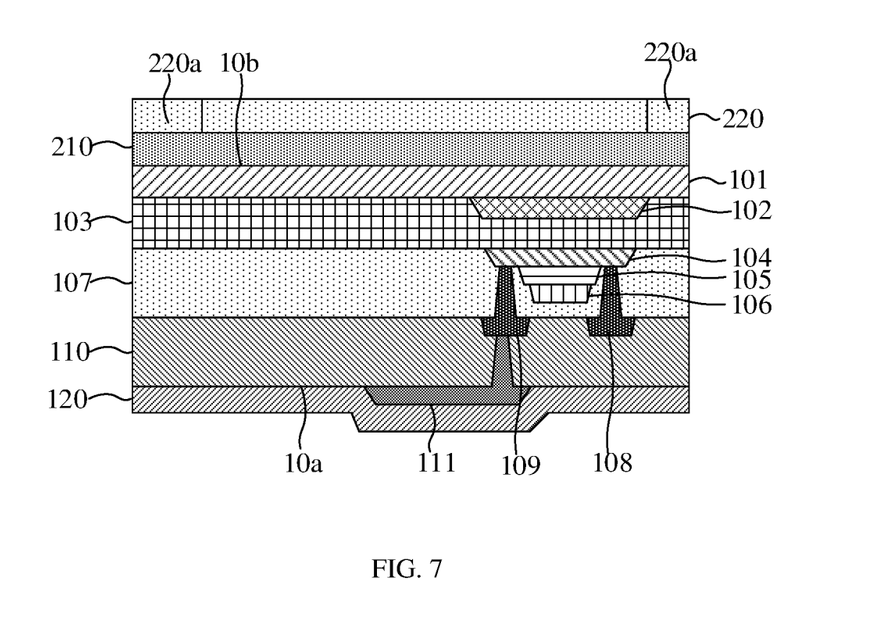

Specifically, referring to FIG. 7, FIG. 7 is a schematic diagram of step S3 in the method of manufacturing the display device in the embodiment of the present invention. The thin-film transistor array substrate is flipped by 180 degrees. In the step S31, a metal film 210 is formed on the second surface 10b by physical vapor deposition (PVD). The metal film 210 is made of a material including copper, aluminum, molybdenum, or combinations thereof. Next, in the step S32, the first photoresist layer 220 is formed by coating on the metal film 210.

Figure 8:
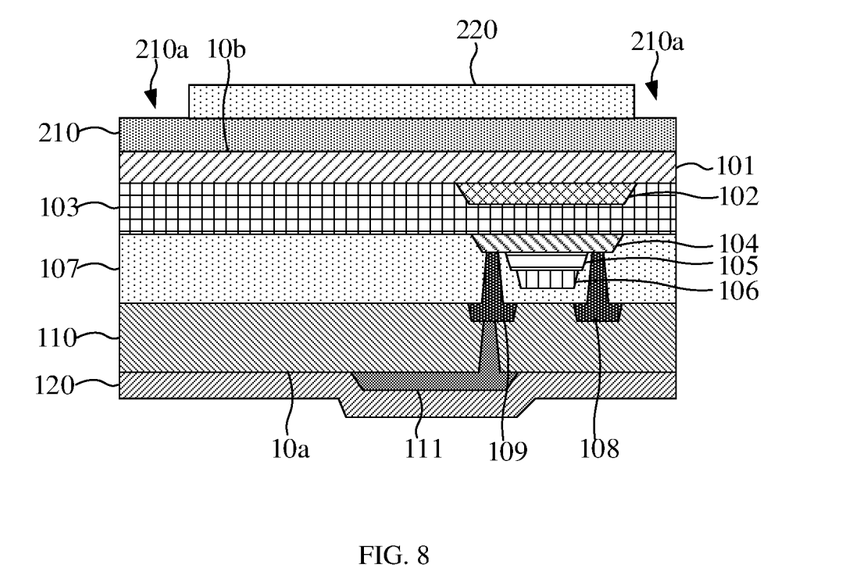

Then, referring to FIG. 7 in conjunction with FIG. 8, in the step S33, an edge exposure machine is used to expose the first photoresist layer 220 at a first predetermined position 220a. In the step S34, the first photoresist layer 220 at the first predetermined position 220a is removed by a developer. The patterns formed by the edge exposure include, but are not limited to, ☐, ☐, ☐, or combinations thereof. The photoresist material of the first photoresist layer 220 includes a positive photoresist material and a negative photoresist material, and a thickness of the first photoresist layer 220 is between 1 μm and 3 μm.

Figure 9:
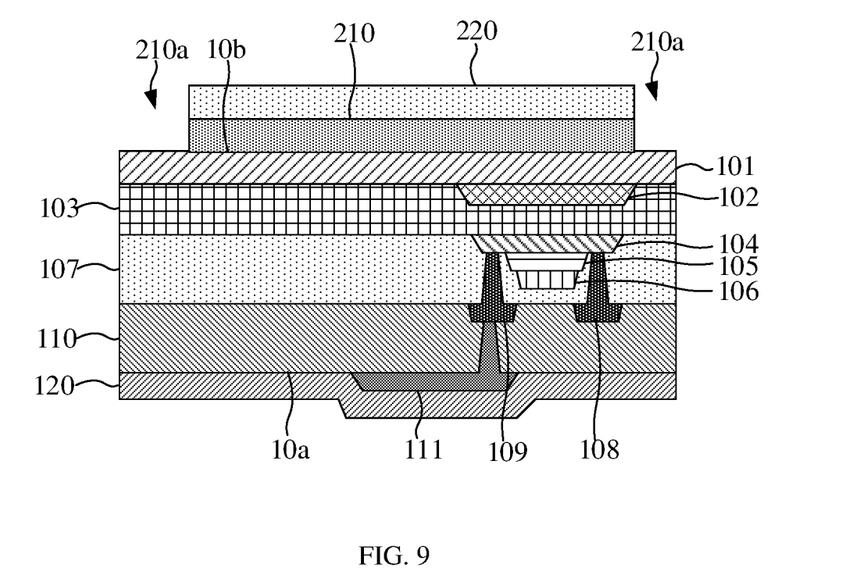
Figure 10:
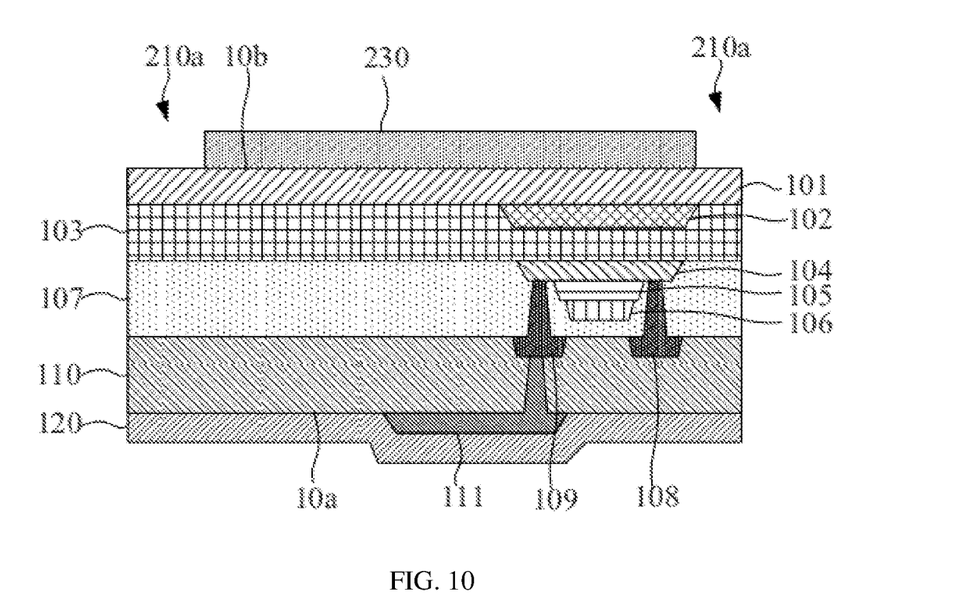

Next, referring to FIG. 9 and FIG. 10, in the step S35, the metal film 210 at the first predetermined position 220a is etched. Then, in the step S36, the first photoresist layer 220 is stripped to form a patterned metal layer 230.

Figure 4:
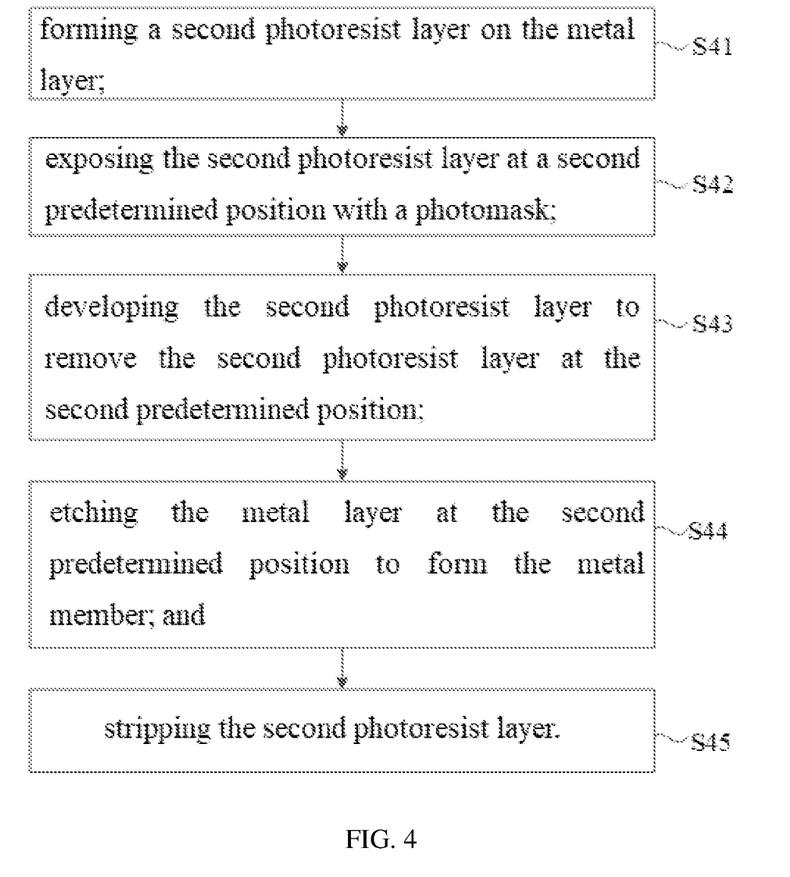

Referring to FIG. 4. step S4 includes:
step S41: forming a second photoresist layer on the metal layer;
step S42: exposing the second photoresist layer at a second predetermined position with a photomask;
step S43: developing the second photoresist layer to remove the second photoresist layer at the second predetermined position;
step S44: etching the metal layer at the second predetermined position to form the metal member; and
step S45: stripping the second photoresist layer.

Figure 11:
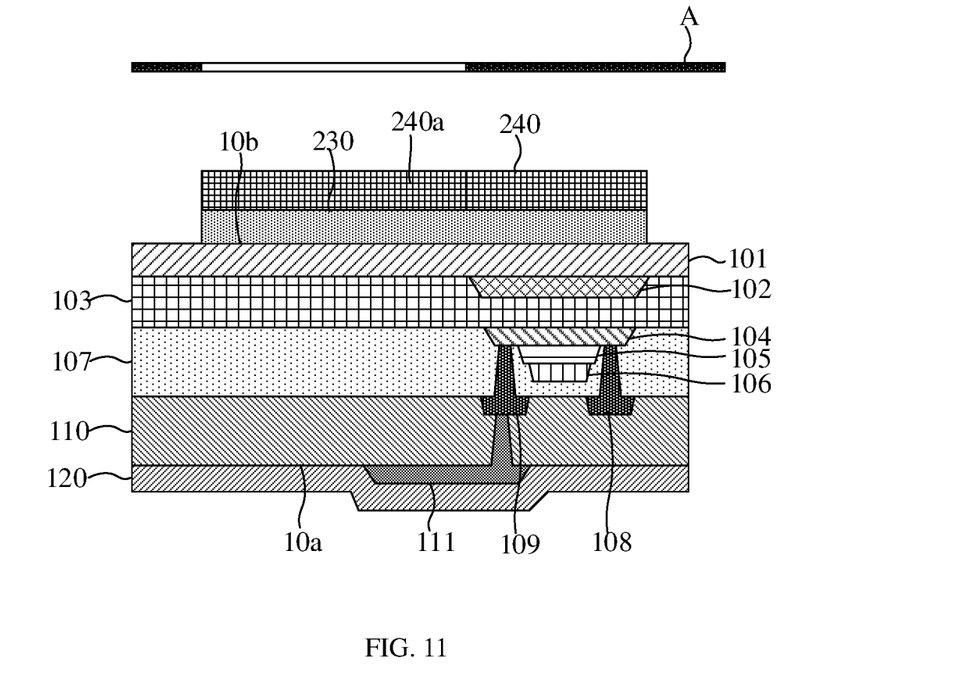

Specifically, referring to FIG. 11, in the step S41, a second photoresist layer 240 is formed by coating on the metal layer 230. Then, in the step S42, the second photoresist layer 240 at a second predetermined position 240a is exposed with a photomask A. A material of the second photoresist layer 240 includes a positive photoresist material and a negative photoresist material, and a thickness of the second photoresist layer 240 is between 1 μm and 3 μm.

Figure 12:
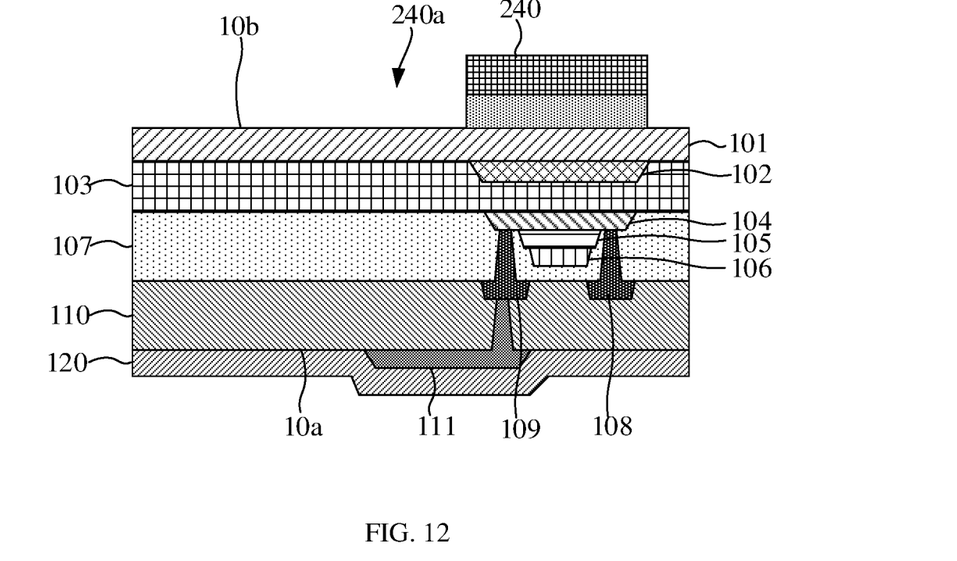

Next, referring to FIG. 12, in the step S43, the second photoresist layer 240 at the second predetermined position 240a is removed by a developer. Subsequently, in the step S44, the metal layer at the second predetermined position 240a is etched. Finally, referring to FIG. 13, the remaining second photoresist layer 240 is stripped to form a patterned metal member 250.

In order to ensure that the external wiring on the front and back sides can be perfectly connected, photolithgraphy on the back side needs to be aligned using an exposure machine. The alignment of the exposure machine is recognized by the reflected light of the mark of the substrate or a grayscale difference caused by a step between layers. In the known technology for manufacturing a metal member, the mark for the front alignment is blocked due to the opacity of the metal, and there is no step on the back corresponding to the mark, so that the exposure machine cannot recognize the mark by the reflected light or grayscale difference. In order to solve this problem, the known technology is to fabricate a transparent non-metal layer on the second surface of the thin-film transistor array substrate, and produce the mark required for the second surface by accurate alignment with the mark on the front side. However, production of the non-metallic film mark requires vacuum film formation, photolithgraphy patterning, etching, and the like. This process requires the use of a photomask, and the time cost and production cost are large. In addition, the reflectivity of the non-metallic film is extremely low, and since the subsequent alignment can only be identified by grayscale, in order to improve the mark recognition ability of the back side process, a layer of metal generally covers the mark of non-metal film. As such, this method not only is relatively complicated, but also has large investment in time cost and production costs.

The metal member 250 in an embodiment of the present invention is formed by two patterning processes. In the first patterning process, the edge exposure machine is used for exposure, and the metal film at the first predetermined position is etched to expose a part of the second surface 10b the thin-film transistor array substrate. The exposed second surface 10b and the unetched metal layer form a difference in grayscale, which effectively improves the accuracy of alignment. In addition, this process does not require a photomask, which greatly reduces the time cost and production cost. Then, in the second patterning process, the metal member 250 is formed through the photomask A.

Compared with the process of manufacturing the metal member in the prior art, the method of manufacturing the metal member in an embodiment of the present invention is not only to omit the steps of manufacturing the non-metal layer and the metal layer used for alignment on the non-metal layer, reducing a photomask, but also to greatly reduce investment in time cost and production cost.

Figure 13:
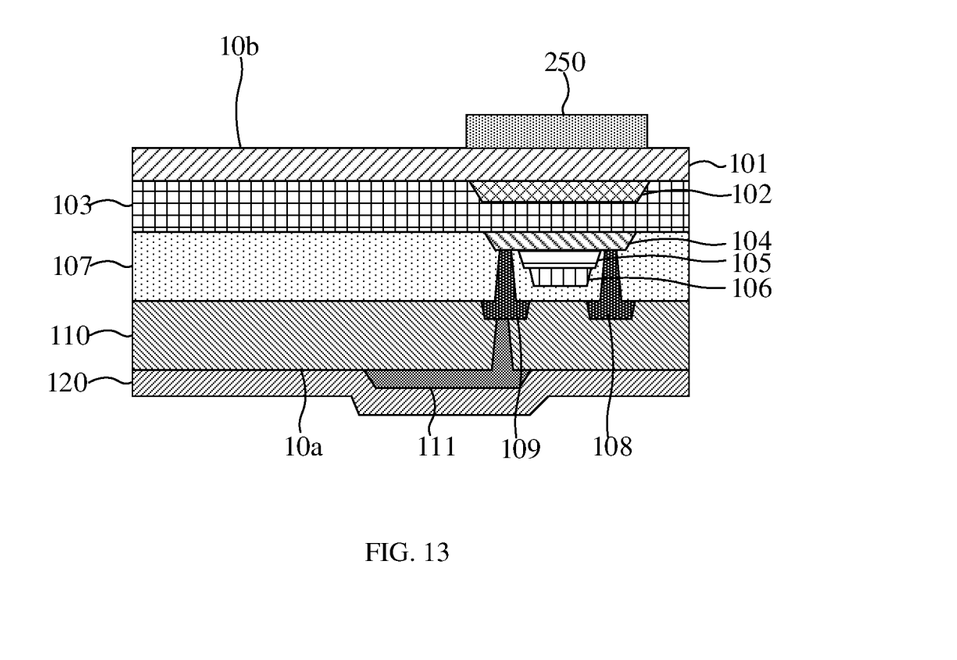

Referring to FIG. 13, in the step S5, a non-metallic film is formed on the second surface 10b by chemical vapor deposition, and the non-metallic film is patterned through photolithgraphy and an etching to form a patterned insulating layer 260. The insulating layer 260 includes, but is not limited to, an inorganic oxide non-metal film made of a material such as silicon nitride ($SiN_x$), silicon oxide ($SiO_x$), silicon oxynitride ($SiO_xN_y$), and the like.

Figure 14:
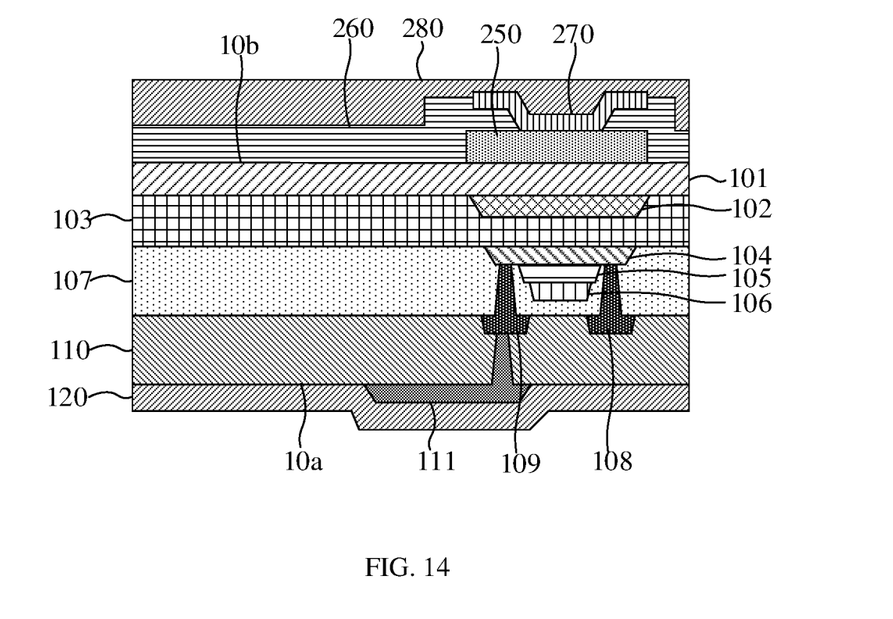

Referring to FIG. 14, in the step S6, a metal oxide film is formed on the insulating layer 260 by magnetron sputtering deposition, and a patterned electrode layer 270 is formed by photolithgraphy and etching. The patterned electrode layer 270 is disposed on the metal member 250. The electrode layer 270 includes, but is not limited to, a metal oxide film made of a material such as indium tin oxide (ITO).

In the step S7, a planarization layer 280 is formed on the insulating layer 260 and the electrode layer 270. Specifically, a positive or negative organic photoresist material is coated by slit-coating or inkjet printing to form the planarization layer 280. A thickness of the planarization layer 280 is between 1.5 micrometers and 5.0 micrometers. For example, the thickness of the planarization layer 280 is any one of 1.5 micrometers, 2.0 micrometers, 2.5 micrometers, 2.8 micrometers, 3.2 micrometers, 4.0 micrometers, 4.5 micrometers, and 5.0 micrometers.

Figure 15:
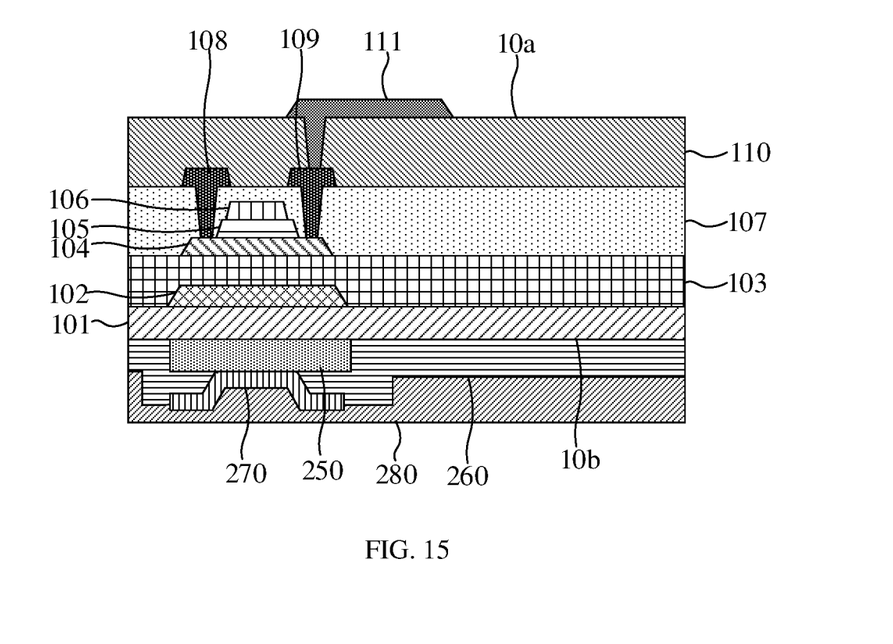

Next, referring to FIG. 15, the display device after step S7 is flipped again by 180 degrees. In the step S8, the protective layer 120 is removed by dry etching or high temperature melting. Specifically, when an inorganic oxide such as such as silicon nitride ($SiN_x$), silicon oxide ($SiO_x$), silicon oxynitride ($SiO_xN_y$), and the like is used as the material of the protective layer 120, the protective layer 120 is removed by an etching. For example, the protective layer 120 is removed by plasma etching or reactive ion etching. When an organic oxide is used as the material of the protective layer 120, the protective layer 120 is removed by high-temperature melting.

Referring to FIG. 1, in the step S9, the LED chip 310 is arranged on the first surface 10a using the mass transfer technology. The LED chip 310 is disposed on the pixel electrode 110, and the LED chip includes a Mini LED chip and a Micro LED chip.

Finally, in the step S10, an optical film 320 is arranged on the LED chip. The optical film 320 is configured to diffuse the light emitted by the LED chip.

It should be noted that the display device formed by the method of manufacturing the display device provided by the embodiment of the present invention can be used for direct display, for example, as a micro-LED display device or a mini-ED display device, applied to the field of display technology.

Embodiments of the present invention provide a display device and a method of manufacturing the display device. In the method of manufacturing the display device, the metal member is formed on the second surface of the thin-film transistor array substrate through two patterning processes. Compared with the process of manufacturing the metal member in the prior art, the method of manufacturing the metal member in an embodiment of the present invention is not only to omit the steps of manufacturing the non-metal layer and the metal layer used for alignment on the non-metal layer, reducing a photomask, thereby improving the technical problem that the steps of the double-sided process of the display device are relatively complicated, but also to greatly reduce investment in time cost and production cost.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A method of manufacturing a display device, comprising the following steps:
   step A: forming a thin-film transistor array substrate, the thin-film transistor array substrate comprising a first surface and a second surface that are disposed opposite to each other;
   step B: forming a protective layer on the first surface of the thin-film transistor array substrate;
   step C: forming a metal layer on the second surface of the thin-film transistor array substrate by a first patterning;
   step D: forming a metal member by performing a second patterning on the metal layer;
   step E: forming a patterned insulating layer on the second surface of the thin-film transistor array substrate, the patterned insulating layer covering at least a part of the metal member;
   step F: forming an electrode layer on the metal member;
   step G: forming a planarization layer on the electrode layer and the patterned insulating layer;
   step H: removing the protective layer;
   step I: disposing a light emitting diode (LED) chip on the first surface of the thin-film transistor array substrate; and
   step J: disposing an optical film on the LED chip.

2. The method of manufacturing the display device according to claim 1, wherein the step C comprises:
step c11: forming a metal film on the second surface of the thin-film transistor array substrate;
step c12: forming a first photoresist layer on the metal film;
step c13: exposing the first photoresist layer at a first predetermined position;
step c14: developing the first photoresist layer at the first predetermined position;
step c15: etching the metal film at the first predetermined position; and
step c16: stripping the first photoresist layer to form the metal layer.

3. The method of manufacturing the display device according to claim 2, wherein the step c13 comprises: exposing the first photoresist layer at the first predetermined position by edge exposure, wherein patterns formed by the edge exposure comprise a square shape, a shape of two squares attached to each other, a square grid shape, or combinations thereof.

4. The method of manufacturing the display device according to claim 1, wherein the step D comprises:
step d11: forming a second photoresist layer on the metal layer;
step d12: exposing the second photoresist layer at a second predetermined position with a photomask;
step d13: developing the second photoresist layer to remove the second photoresist layer at the second predetermined position;
step d14: etching the metal layer at the second predetermined position to form the metal member; and
step d15: stripping the second photoresist layer.

5. The method of manufacturing the display device according to claim 1, wherein the protective layer in the step B is made of a material comprising at least one of silicon nitride, silicon oxide, silicon oxynitride, and an organic material.

6. The method of manufacturing the display device according to claim 5, wherein a thickness of the protective layer is greater than 100 nanometers.

7. The method of manufacturing the display device according to claim 1, wherein the step H comprises:
removing the protective layer by dry etching or high temperature melting.

8. The method of manufacturing the display device according to claim 1, wherein the step G comprises:
coating a positive or negative organic photoresist material by slit-coating or inkjet printing to form the planarization layer.

9. The method of manufacturing the display device according to claim 8, wherein a thickness of the planarization layer ranges between 1.5 microns and 5.0 microns.

10. The method of manufacturing the display device according to claim 1, wherein the metal member is made of a material comprising copper, aluminum, molybdenum, or combinations thereof.

11. The method of manufacturing the display device according to claim 1, wherein the thin-film transistor array substrate comprises:
a substrate;
a light-shielding layer disposed on the substrate;
a buffer layer covering the substrate and the light shielding layer;
an active layer disposed on the buffer layer;
a gate insulating layer disposed on the active layer;
a gate disposed on the gate insulating layer;
an interlayer dielectric layer covering the active layer, the gate, and the gate insulating layer;
a source and a drain disposed on the interlayer dielectric layer;
a passivation layer covering the source, the drain, and the interlayer dielectric layer; and
a pixel electrode layer disposed on the passivation layer.

12. The method of manufacturing the display device according to claim 11, wherein a material of the light-shielding layer comprises a black metal light-shielding material, an inorganic oxide light-shielding material, an organic light-shielding material, or combinations thereof.

13. The method of manufacturing the display device according to claim 1, wherein the LED chip comprises a mini-LED chip and/or a micro-LED chip.

* * * * *